United States Patent [19]

Noda et al.

[11] 4,208,695
[45] Jun. 17, 1980

[54] PROXIMITY DETECTOR

[75] Inventors: Masahiro Noda; Ryoji Takahashi, both of Inazawa, Japan

[73] Assignee: Mitsubishi Denki Kabushiki Kaisha, Tokyo, Japan

[21] Appl. No.: 889,981

[22] Filed: Mar. 24, 1978

[30] Foreign Application Priority Data

Mar. 24, 1977 [JP] Japan .................................. 52-32634

[51] Int. Cl.² ........................ H03D 13/00; B66B 13/26
[52] U.S. Cl. .................................... 361/181; 361/203; 340/562; 340/563; 307/116; 49/25
[58] Field of Search .................... 340/562, 563, 258 B; 361/203, 181; 331/65; 307/116; 49/25

[56] References Cited

U.S. PATENT DOCUMENTS

| 2,720,284 | 10/1955 | Galanty | 187/48 |
| 3,181,856 | 5/1965 | Dyben | 49/25 |
| 3,231,815 | 1/1966 | Spencer | 331/65 |
| 3,992,634 | 11/1976 | Larson | 307/116 |

FOREIGN PATENT DOCUMENTS

| 2257797 | 11/1972 | Fed. Rep. of Germany | 340/562 |
| 7734621 | 6/1978 | France | 49/25 |
| 2636471 | 6/1971 | Japan | 361/181 |

Primary Examiner—J. D. Miller
Assistant Examiner—L. Schroeder
Attorney, Agent, or Firm—Oblon, Fisher, Spivak, McClelland & Maier

[57] ABSTRACT

A proximity detector comprises a pair of antennae being disposed along the front edge of a door and at a space therebetween, a pair of coils constituting series resonance circuits, together with each electrostatic capacities of the antennae which are connected in series with the coils, an AC power source for supplying voltages to the series resonance circuits; rectifying circuits for rectifying the voltages produced on the antennae by the AC power source, and a differential amplifier circuit for amplifying difference between the outputs of the rectifying circuits, the output of the differential amplifier controlling the movement of the door.

3 Claims, 4 Drawing Figures

PROXIMITY DETECTOR

BACKGROUND OF THE INVENTION

The present invention relates to a proximity detector for detecting a substrate through a change of electrostatic capacity.

A proximity detector is placed on the front edge of the door of an elevator apparatus and the like. When the door closes or fully opens, it detects an obstacle on the door travelling path in non-contact manner, to reversely open the door or stop the closing operation of the door.

An exemplary circuit of this kind proximity detector of prior art will be shown in FIG. 1. In the figure, reference numerals (1) and (2) are a pair of antennae disposed longitudinally with a space therebetween along the front edge of the door and have electrostatic capacities (3) and (4) against earth. These antennae (1) and (2) have electrostatic capacities (6) and (7) to a shield plate (5) disposed with insulation from these antennae. The antennae and the shield plate are disposed so as to satisfy the relation, electrostatic capacity (3)×electrostatic capacity (7)=electrostatic capacity (4)×electrostatic capacity (6).

Reference numeral (8) is an AC power source to supply voltage to a bridge circuit comprised of the capacities (3) and (4) and capacities (6) and (7). A transformer (9) is used to detect unbalance in the bridge circuit.

Normally, this bridge circuit is balanced and, when a substrate approaches to the antennae (1) or (2), the approach of the substrate is asymmetrically made to the antennae (1) and (2) so that the bridge circuit produces an unbalance output signal. This is detected by a transformer (9), amplified by an AC amplifier (10), rectified by a rectifying circuit (11), and the output of the rectifying circuit is amplified by a DC amplifier (12) to drive a relay (13). Through the operation of the relay (13), closing operation of the door of the elevator is stopped or reversed to prevent the substrate from being nipped by the door.

In this apparatus, the electrostatic capacities (3) and (4) between the antennae (1) and (2), and earth are disposed separately from the capacities (6) and (7) between the antennae (1) and (2), and the shield plate (5). For this, insulation must be doubly made for the antennae (1) and (2) and earth; one insulation is made between earth and the shield plate and another between the shield plate (5) and the antennae (1) and (2).

During closing of the door, if one desires a sufficiently high sensitivity, the output voltage of the AC power source (8) must be large in order to prevent erroneous operation or sensitivity reduction due to characteristic change of parts used in the amplifier and the like.

Even if the capacitances of the electrostatic capacities (3), (4), (6) and (7) forming respective bridge arms of the bridge circuit are balanced, a slight dielectric loss tangent (tan δ) produces a phase difference of the voltage induced in the antennae (1) and (2), and a phase unbalance voltage appears at the output of the detecting transformer (9). For this, it is difficult to sufficiently increase the sensitivity of detection during the door closing.

With a view of overcoming the above-mentioned disadvantages, the present invention has an object to provide a proximity detector with a simplified assemblage of the related parts of the antennae, elimination of the phase unbalance voltage and high sensitivity.

SUMMARY OF THE INVENTION

According to the present invention, there is provided a proximity detector comprising; a pair of antennae being disposed along the front edge of a door and at a space therebetween; a pair of coils constituting series resonance circuits, together with earth electrostatic capacities of the antennae which are connected in series with the coils; an AC power source for supplying voltages to the series resonance circuits; rectifying circuits for rectifying the voltages produced in the antennae by the AC power source; and a differential amplifier circuit for amplifying difference between the outputs of the rectifying circuits, the output of the differential amplifier controlling the movement of the door.

The present invention will be better understood from the following description taken in connection with the accompanying drawings, in which like reference characters refer to like parts or similar parts, and in which.

DESCRIPTION OF THE PREFERRED EMBODIMENT

An embodiment that the present invention is applied to a side opening door of an elevator will be given with reference to FIGS. 2 and 3.

Figure 1:
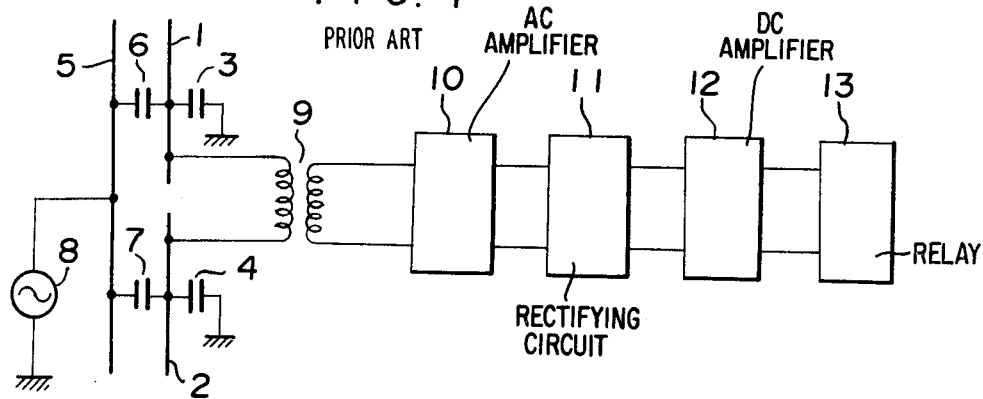
FIG. 1 shows a typical circuit diagram of a conventional proximity detector.
Figure 2:
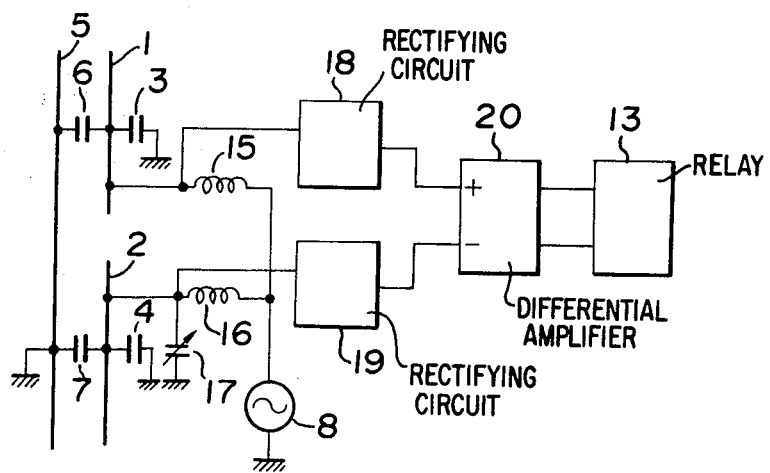
FIG. 2 shows a circuit diagram of an embodiment of a proximity detector according to the present invention.
Figure 3:
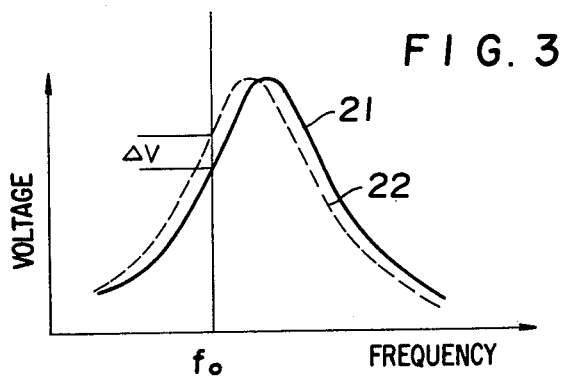
FIG. 3 is frequency characteristic curves of series resonance circuits of FIG. 2.

In FIG. 2, reference numerals (15) and (16) are coils, and antennae (1) and (2) are connected to an AC power source (8), through the coils (15) and (16). One end of the AC power source (8) is connected to have the same potential as of earth. A balancing variable capacitor (17) is connected between the antennae and earth. Reference numerals (18) and (19) designate rectifying circuits which converts an AC voltage appearing at the antennae (1) and (2) into a DC voltage. A differential amplifier (20) amplifies a difference voltage between the DC outputs of the rectifying circuits (18) and (19).

The sum of a electrostatic capacity (3) between the antenna (1) and earth and another electrostatic capacity (6) between the antenna (1) and the shield plate (5), forms a series resonance circuit, together with the coil (15). Similarly, the sum of a capacity (4) between the antenna (2) and earth, a capacity (7) between the same and the shield plate (5) and a variable capacitor (17), forms a series resonance circuit, together with the coil (16).

The variable capacitor (17) is so adjusted that these resonance circuits have much the same resonance frequencies. As shown, the frequency characteristic of each series resonance circuit is indicated by a curve (21) and the frequency $f_o$ of the AC power source (8) shown in FIG. 2 is set up on the steep slope portion of the characteristic curve. Thus, because of use of the series resonance circuits, an AC voltage appearing on each of the antennae (1) and (2) is very large against the output voltage of the AC power source (8). The output voltage is converted by the rectifying circuits (18) and (19) into DC voltages which in turn are applied to the differential amplifier (20) where both the rectified outputs are differentially amplified. When the antennae (1) and (2) detect no substrate, the variable capacitor (17) is so adjusted that the amplitudes of the AC voltages appearing on the antennae (1) and (2) are equal. As a result, the unbalance voltage due to a slight phase difference of the voltages on the antennae (1) and (2) does not appear at the output of the differential amplifier circuit (20). When the antenna (1) or (2) detects a substrate, and the earth electrostatic capacity increases, the resonance characteristic curve (21) shown in FIG. 3 shifts to another resonance characteristic curve (22) of lower frequencies. At this time, the output voltages appearing at the antennae (1) and (2) at the frequency $f_o$ of the AC power source in FIG. 2 increase by delta ($\Delta$) V, compared to that when the antennae (1) and (2) does not detect the substrate.

Since a steep portion of the resonance curve is used, even if the rate of increase of the earth electrostatic capacities by object detection is small with respect to the sum of the earth electrostatic capacities of the antennae (1) and (2), it is possible to obtain sufficiently large change of voltage.

The AC voltages at the respective antennae by object detection are converted by the rectifying circuits (18) and (19) into DC voltages of which the difference is amplified by the differential amplifier (20) to drive the relay (13). The relay (13) stops or reverses the closing operation of the elevator door to prevent the substrate from being nipped by the door.

Figure 4:
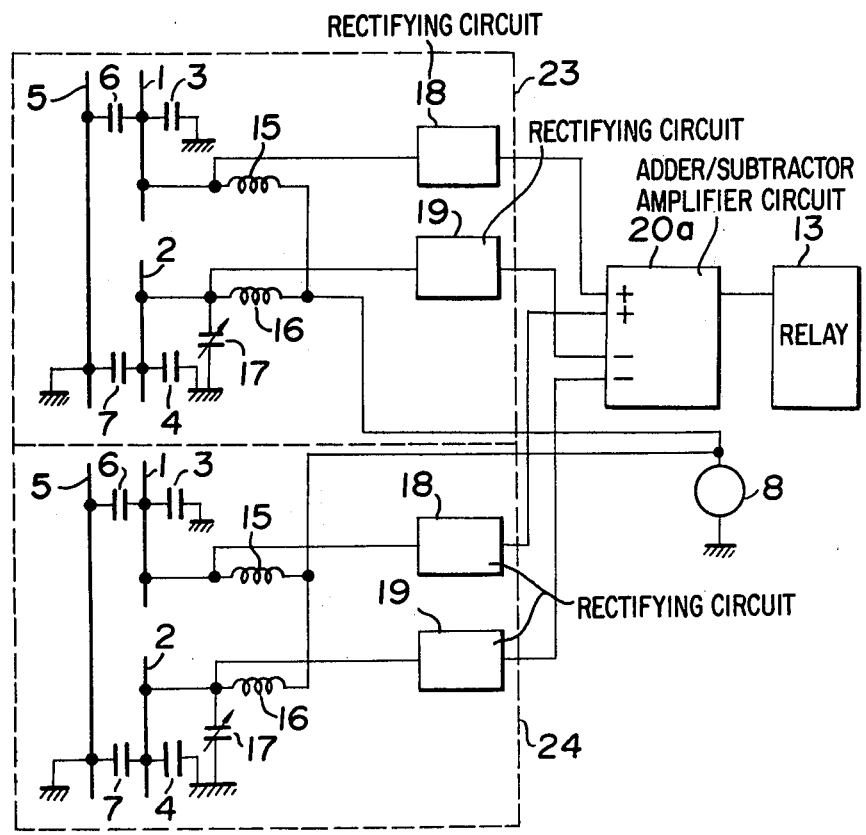
FIG. 4 shows a circuit diagram of another embodiment of the present invention.

FIG. 4 shows another embodiment in which the present invention is applied to two pannel door. In the figure, (23) and (24) designate detectors of the proximity detector each including antennae (1) and (2), shield plate (5), variable capacitor (17), coils (15) and (16), and rectifying circuits (18) and (19). Reference numeral (20a) designates adder/subtraction amplifier circuit. The detectors (23) and (24) are mounted on the two pannel door. The adder/subtractor amplifier circuit (20a) amplifies the sum of the difference between the rectified outputs of the detector (23) and the difference between the rectified outputs of the detector (24). In this way, the example has an ability to detect substrate on the front edges of the respective pannels.

Only two antennae (1) and (2) are illustrated in one of the detector of FIG. 2 and FIG. 4. However, a plurality of antennae connected in parallel and longitudinally spaced may be used which equivalent to the construction of FIG. 2 or FIG. 4. In FIGS. 2 and 4, only one of the antennae (1) and (2) is provided with the variable capacitor (17) for unbalance adjustment which is inserted between the antenna and earth. The variable capacitors may be used for both the antennae (1) and (2). The frequency of the AC power source (8) may be set up on the steep portion of the resonance characteristic curve at the high frequency side.

As described above, the present invention is constructed such that series resonance circuits are formed by coils connected to the antennae and the earth electrostatic capacities of the antennae, voltages produced on the antennae are rectified and amplified and the movement of the door is controlled by the output of the amplified output. Therefore, the detector produces a large output, with a small AC input voltage thereto. Additionally, there is eliminated an unbalance voltage due to a slight phase difference so that a very high sensitivity of detection may be obtained. Further, there is no insulation of the antenna shield plate to ground and therefore the apparatus may be easily mounted on the door.

What is claimed is:

1. A proximity detector comprising; a pair of antennae being disposed along the front edge of a door and at a space therebetween; a pair of coils constituting series resonance circuits, together with earth electrostatic capacities of said antennae which are connected in series with said coils; an AC power source for supplying voltages to said series resonance circuits; rectifying circuits for rectifying the voltages produced in said antennae by said AC power source; and differential amplifier circuit for amplifying difference between the outputs of said rectifying circuits, the output of said differential amplifier controlling the movement of said door.

2. A proximity detector according to claim 1 wherein a variable capacitor is connected between one of the antennae and earth to adjust amplitudes of AC voltage appearing on the antennae.

3. A proximity detector according to claim 1 wherein a pair of the coils, the electrostatic capacities and the rectifying circuits connected in series are provided on each of two panel door to connect them to an adder/subtractor.

* * * * *